(12) United States Patent
Gehrke et al.

(10) Patent No.: US 6,489,221 B2
(45) Date of Patent: *Dec. 3, 2002

(54) HIGH TEMPERATURE PENDEOEPITAXIAL METHODS OF FABRICATING GALLIUM NITRIDE SEMICONDUCTOR LAYERS ON SAPPHIRE SUBSTRATES

(75) Inventors: Thomas Gehrke, Carrboro, NC (US); Kevin J. Linthicum, Angier, NC (US); Robert F. Davis, Raleigh, NC (US); Darren B. Thomson, Cary, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/780,715

(22) Filed: Feb. 9, 2001

(65) Prior Publication Data

US 2001/0008791 A1 Jul. 19, 2001

Related U.S. Application Data

(63) Continuation of application No. 09/441,753, filed on Nov. 17, 1999.

(51) Int. Cl.$^7$ ............................................. H01L 21/20
(52) U.S. Cl. .......................... 438/479; 438/481; 438/478
(58) Field of Search .................................. 438/481, 483, 438/484, 681; 433/462, 478, 483

(56) References Cited

U.S. PATENT DOCUMENTS

| 4,127,792 A | 11/1978 | Nakata ........................ 313/500 |
| 4,522,661 A | 6/1985 | Morrison et al. ........... 148/33.2 |

(List continued on next page.)

FOREIGN PATENT DOCUMENTS

| CA | 2258080 | 10/1998 |
| EP | 0 551 721 A2 | 7/1993 |

(List continued on next page.)

OTHER PUBLICATIONS

Jeon et al., "Effect of Initial Layers for High–Quality GaN Growth by Hot–Wall Epitaxy", Journal of Crystal Growth, vol. 189/190 (1998), pp. 250–253.*

Honda et al., Selective Area Growth of GaN Microstructures on Patterned (111) and (001) Si Substrates, 4$^{th}$ European Workshop on GaN, Nottingham, Jul. 2–5, 2000.

(List continued on next page.)

*Primary Examiner*—Wael Fahmy
*Assistant Examiner*—William M. Brewster
(74) *Attorney, Agent, or Firm*—Moore & Van Allen, PLLC; Steven B. Phillips

(57) ABSTRACT

Embodiments of the present invention pendeoepitaxially grow sidewalls of posts in an underlying gallium nitride layer that itself is on a sapphire substrate, at high temperatures between about 1000° C. and about 1100° C. and preferably at about 1100° to reduce vertical growth of gallium nitride on the trench floor from interfering with the pendeoepitaxial growth of the gallium nitride sidewalls of the posts. Thus, widely available sapphire substrates may be used for pendeoepitaxial of gallium nitride, to thereby allow reduced cost and/or wider applications for gallium nitride devices. More specifically, gallium nitride semiconductor layers may be fabricated by etching an underlying gallium nitride layer on a sapphire substrate, to define at least one post in the underlying gallium nitride layer and at least one trench in the underlying gallium nitride layer. The at least one post includes a gallium nitride top and a gallium nitride sidewall. The at least one trench includes a trench floor. The gallium nitride sidewalls are laterally grown into the at least one trench, to thereby form a gallium nitride semiconductor layer.

32 Claims, 11 Drawing Sheets

U.S. PATENT DOCUMENTS

| | | | |
|---|---|---|---|
| 4,651,407 A | 3/1987 | Bencuya | 29/571 |
| 4,865,685 A | 9/1989 | Palmour | 156/643 |
| 4,876,210 A | 10/1989 | Barnett et al. | 437/5 |
| 4,912,064 A | 3/1990 | Kong et al. | 437/100 |
| 4,946,547 A | 8/1990 | Palmour et al. | 156/643 |
| 4,985,742 A * | 1/1991 | Pankove | 257/197 |
| 5,122,845 A | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,912,477 A | 6/1999 | Negley | 257/95 |
| 5,915,194 A | 6/1999 | Powell et al. | 438/478 |
| 6,051,849 A | 4/2000 | Davis | 257/190 |
| 6,064,078 A * | 5/2000 | Northrup et al. | 257/98 |
| 6,100,104 A | 8/2000 | Haerle | 438/33 |
| 6,100,111 A | 8/2000 | Konstantinov | 438/92 |
| 6,121,121 A | 9/2000 | Koide | 438/481 |
| 6,153,010 A | 11/2000 | Kiyoku et al. | 117/95 |
| 6,156,584 A | 12/2000 | Itoh et al. | 438/33 |
| 6,177,688 B1 * | 1/2001 | Linthicum et al. | 257/190 |
| 6,261,929 B1 * | 7/2001 | Gehrke et al. | 438/462 |
| 6,265,289 B1 * | 7/2001 | Zheleva et al. | 438/503 |

FOREIGN PATENT DOCUMENTS

| | | |
|---|---|---|
| EP | 0 852 416 A1 | 7/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |

OTHER PUBLICATIONS

Gallium Nitride–2000–Technology, Status, Applications, and Market Forecasts, Strategies Unlimited, Report RC–23, May 2000.

International Search Report, PCT/US99/28056, Apr. 26, 2000.

International Search Report, PCT/US99/27358, Apr. 28, 2000.

Gehrke et al., Pendeo–Epitaxial Growth of Gallium Nitride on Silicon Substrates, Journal of Electronic Materials, vol. 29, No. 3, Mar. 2000, pp. 306–310.

Gehrke et al., Pendeo–Epitaxy of Gallium Nitride and Aluminum Nitride Films and Heterostructures on Silicon Carbide Substrate, MRS Internet J. Semicond. Res. 4S1, G3.2, 1999, 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

International Search Report, PCT/US99/12967, Oct. 18, 1999.

Chen et al., Dislocation Reduction in GaN Thin Films Via Lateral Overgrowth From Trenches, Applied Physics Letters, vol. 75, No. 14, Oct. 4, 1999, pp. 2062–2063.

International Search Report, PCT/US99/04346, Jun. 9, 1999.

Linthicum et al., Pendeoepitaxy of Gallium Nitride Thin Films, Applied Physics Letters, vol. 75, No. 2, Jul. 12, 1999, pp. 196–198.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C With a Fundamental Transverse Mode, Jpn. J. Appl. Phys. vol. 38, Part 1, No. 3A, Mar. 1, 1999, pp. L226–L229.

Leo Unmasked by Pendeo–Epitaxy: A New Approach for Lateral Growth of Gallium Nitride Films, Journal of Electronic Materials, vol. 28, No. 4, Feb. 1999, pp. L5–L8.

Boo et al., Growth of Hexagonal GaN Thin Films on Si(111) with Cubic SiC Buffer Layers, Journal of Crystal Growth 189–190, 1998, pp. 183–188.

Zheleva et al., Pendeo–Epitaxy—A New Approach for Lateral Growth of GaN Structures, MRS Internet Journal of Nitride Semiconductor Research, 1999, Online!, vol. 4S1, No. G3.38, Nov. 30–Dec. 4, 1998.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Nakamura et al., InGaN/GaN/AlGaN–Based Laser Diodes Grown on GaN Substrates With a Fundamental Transverse Mode, Jpn. J. Appl. Phys., vol. 37, Sep. 15, 1998, pp. L1020–L1022.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, pp. 179–182.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews Series No. 23, 1998, pp. 440–446.

Nakamura et al., InGaN/GaN/AlGaN–Based Laser Diodes With Modulation–Doped Strained Layer–Superlattices, Jpn. J. Appl. Phys., vol. 36, Dec. 1, 1997, pp. L1568–L1571.

Sakai, Defect Structure in Selectively Grown GaN Films With Low Threading Dislocation Density, Appl. Phys. Lett., vol. 71, No. 16, Oct. 20, 1997, pp. 2259–2261.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction via Lateral Epitaxy in Selectively Grown GaN Structures, Appl. Phys. Lett., vol. 71, No. 17, Oct., 27, 1997, pp. 2472–2474.

Nam, et al., "Growth on GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Steckl et al., SiC Rapid Thermal Corbonization of the (111)Si Semiconductor–on–Insulator Structure and Subsequent Metalorganic Chemical Vapor Deposition, Appl. Phys. Let., 69 (15), Oct. 7, 1996, pp. 2264–2266.

Kapolnek et al., "Selective Area Epitaxy of GaN for Electron Field Emission Devices", Journal of Crystal Growth, 5451, 1996, pp. 1–4.

Weeks et al., "GaN Thin Films Deposited Via Organometallic Vapor Phase Epitaxy on $\alpha(6-H)SiC(0001)$ Using High–Temperature Monocrystalline AlN Buffer Layers", Appl. Phys. Lett. 67 (3), Jul. 17, 1995, pp. 401–403.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Gustafsson et al., Investigations of High Quality $Ge_xSi_{1-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, "Lateral Supply Mechanisms in Selective Metalorganic Chemical Vapor Deposition", Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Ishiwara et al., Lateral Solid Phase Epitaxy of Amorphous Si Films on Si Substrates With $SiO_2$ *Patterns*, Applied Physics Letters, vol. 43, No. 11, Dec. 1, 1983, pp. 1028–1030.

Yoshida et al., Improvements on the Electrical and Luminescent Properties of Reactive Molecular Beam Epitaxially Grown GaN Film by Using AlN–Coated Sapphire Substrates, Applied Physics Letters, vol. 42, No. 5, Mar. 1, 1983, pp. 427–429.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of the Electrochemical Society, Oct. 1982, pp. 2303–2306.

Shaw, Selective Epitaxial Deposition of Gallium Arsenide in Holes, Journal of the Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

* cited by examiner

HIGH TEMPERATURE PENDEOEPITAXIAL METHODS OF FABRICATING GALLIUM NITRIDE SEMICONDUCTOR LAYERS ON SAPPHIRE SUBSTRATES

CROSS REFERENCE TO RELATED APPLICATION

This application is a continuation of application Ser. No. 09/441,753, filed Nov. 17, 1999, entitled Pendeoepitaxial Methods Of Fabricating Gallium Nitride Semiconductor Layers On Sapphire Substrates, And Gallium Nitride Semiconductor Structures Fabricated Thereby, assigned to the assignee of the present invention, the disclosure of which is hereby incorporated herein by reference.

FEDERAL SPONSORED RESEARCH

This invention was made with Government support under Office of Naval Research Contract Nos. N00014-96-1-0765, N00014-98-1-0384, and N00014-98-1-0654. The Government may have certain rights to this invention.

FIELD OF THE INVENTION

This invention relates to microelectronic device fabrication methods, and more particularly to gallium nitride semiconductor fabrication methods.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It also is known to produce low defect density gallium nitride layers by forming a mask on a layer of gallium nitride, the mask including at least one opening therein that exposes the underlying layer of gallium nitride, and laterally growing the underlying layer of gallium nitride through the at least one opening and onto the mask. This technique often is referred to as "Epitaxial Lateral Overgrowth" (ELO). The layer of gallium nitride may be laterally grown until the gallium nitride coalesces on the mask to form a single layer on the mask. In order to form a continuous layer of gallium nitride with relatively low defect density, a second mask may be formed on the laterally overgrown gallium nitride layer, that includes at least one opening that is offset from the opening in the underlying mask. ELO then again is performed through the openings in the second mask to thereby overgrow a second low defect density continuous gallium nitride layer. Microelectronic devices then may be formed in this second overgrown layer. ELO of gallium nitride is described, for example, in the publications entitled *Lateral Epitaxy of Low Defect Density GaN Layers Via Organometallic Vapor Phase Epitaxy* to Nam et al., Appl. Phys. Lett. Vol. 71, No. 18, Nov. 3, 1997, pp. 2638–2640; and *Dislocation Density Reduction Via Lateral Epitaxy in Selectively Grown GaN Structures* to Zheleva et al, Appl. Phys. Lett., Vol. 71, No. 17, Oct. 27, 1997, pp. 2472–2474, the disclosures of which are hereby incorporated herein by reference.

It also is known to produce a layer of gallium nitride with low defect density by forming at least one trench or post in an underlying layer of gallium nitride to define at least one sidewall therein. A layer of gallium nitride is then laterally grown from the at least one sidewall. Lateral growth preferably takes place until the laterally grown layers coalesce within the trenches. Lateral growth also preferably continues until the gallium nitride layer that is grown from the sidewalls laterally overgrows onto the tops of the posts. In order to facilitate lateral growth and produce nucleation of gallium nitride and growth in the vertical direction, the top of the posts and/or the trench floors may be masked. Lateral growth from the sidewalls of trenches and/or posts also is referred to as "pendeoepitaxy" and is described, for example, in publications entitled *Pendeo-Epitaxy: A New Approach for Lateral Growth of Gallium Nitride Films* by Zheleva et al., Journal of Electronic Materials, Vol. 28, No. 4, February 1999, pp. L5–L8; and *Pendeoepitaxy of Gallium Nitride Thin Films* by Linthicum et al., Applied Physics Letters, Vol. 75, No. 2, July 1999, pp. 196–198, the disclosures of which are hereby incorporated herein by reference.

ELO and pendeoepitaxy can provide relatively large, low defect gallium nitride layers for microelectronic applications. However, a major concern that may limit the mass production of gallium nitride devices is the growth of the gallium nitride layers on a silicon carbide substrate. Notwithstanding silicon carbide's increasing commercial importance, silicon carbide substrates still may be relatively expensive. Moreover, it may be difficult to use silicon carbide substrates in optical devices, where back illumination may be desired, because silicon carbide is opaque Accordingly, the use of an underlying silicon carbide substrate for fabricating gallium nitride microelectronic structures may adversely impact the cost and/or applications of gallium nitride devices.

SUMMARY OF THE INVENTION

Embodiments of the present invention pendeoepitaxially grow sidewalls of posts in an underlying gallium nitride layer that itself is on a sapphire substrate, at high temperatures between about 1000° C. and about 1100° C. and preferably at about 1100° to reduce vertical growth of gallium nitride on the trench floor from interfering with the pendeoepitaxial growth of the gallium nitride sidewalls of the posts. Thus, widely available sapphire substrates may be used for pendeoepitaxial of gallium nitride, to thereby allow reduced cost and/or wider applications for gallium nitride devices.

More specifically, gallium nitride semiconductor layers may be fabricated by etching an underlying gallium nitride layer on a sapphire substrate, to define at least one post in the underlying gallium nitride layer and at least one trench in the underlying gallium nitride layer. The at least one post includes a gallium nitride top and a gallium nitride sidewall. The at least one trench includes a trench floor. The gallium nitride sidewalls are laterally grown into the at least one trench, to thereby form a gallium nitride semiconductor layer.

When the sapphire substrate is exposed to the gas phase during growth of gallium nitride, it has been found that gallium nitride can nucleate on the sapphire. Thus, vertical growth of gallium nitride may take place from the sapphire trench floors, that can interfere with lateral growth of the gallium nitride sidewalls into the at least one trench. Alternatively, because of the presence of ammonia, the exposed areas of the surface of the sapphire may be converted to aluminum nitride. Unfortunately, gallium nitride can nucleate well on aluminum nitride, and thereby allow vertical growth of the gallium nitride from the trench floor, which can interfere with the lateral growth of the gallium nitride sidewalls.

The conversion of the exposed areas of the surface of the sapphire to aluminum nitride may be reduced and preferably eliminated by using a high growth temperature for growing the gallium nitride. For example, a temperature of about 1100° C. may be used rather than a conventional temperature of about 1000° C.

The sapphire substrate also may be etched beneath the at least one trench sufficiently deep to create a sapphire floor and to prevent vertical growth of gallium nitride from the sapphire floor from interfering with the lateral growth of the gallium nitride sidewalls of the at least one post into the at least one trench. Alternatively or in addition, the trench floor may be masked with a mask. In yet other alternatives, the underlying gallium nitride layer is selectively etched to expose the sapphire substrate and create a sapphire floor. The gallium nitride post tops also may be masked to reduce nucleation of gallium nitride thereon, compared to on gallium nitride. Following growth, at least one microelectronic device may be formed in the gallium nitride semiconductor layer.

Even more specifically, an underlying gallium nitride layer on a sapphire substrate is etched to selectively expose the sapphire substrate and define at least one post and at least one trench in the underlying gallium nitride layer. The at least one post each includes a gallium nitride top and a gallium nitride sidewall. The at least one trench includes a sapphire floor. The gallium nitride sidewall of the at least one post is grown laterally into the at least one trench, to thereby form a gallium nitride semiconductor layer.

Preferably, when etching the underlying gallium nitride layer on the sapphire substrate, the sapphire substrate is etched as well, to define at least one post in the underlying gallium nitride layer and in the sapphire substrate, and at least one trench in the underlying gallium nitride layer and in the sapphire substrate. The at least one post each includes a gallium nitride top, a gallium nitride sidewall and a sapphire sidewall. The at least one trench includes a sapphire floor. More preferably, the sapphire substrate is etched sufficiently deep to prevent vertical growth of gallium nitride from the sapphire floor from interfering with the step of laterally growing the gallium nitride sidewalls of the at least one post into the at least one trench. For example, the sapphire sidewall height to sapphire floor width ratio exceeds about 1/4. In another embodiment, the sapphire floor is masked with a mask that reduces nucleation of gallium nitride thereon compared to on sapphire.

In yet other embodiments, the sapphire substrate includes an aluminum nitride buffer layer thereon. During the etching step, the gallium nitride layer and the aluminum nitride buffer layer both are etched to selectively expose the sapphire substrate. In other embodiments, the sapphire substrate also is selectively etched so that the trenches extend into the sapphire substrate.

Lateral growth preferably proceeds pendeoepitaxially by laterally overgrowing the gallium nitride sidewall onto the gallium nitride top, to thereby form a gallium nitride semiconductor layer. Prior to pendeoepitaxial growth, the gallium nitride top may be masked with a mask that reduces nucleation of gallium nitride thereon compared to on gallium nitride.

According to another aspect of the present invention, the trench floor may be masked with a mask, thereby obviating the need to expose the sapphire substrate. Specifically, an underlying gallium nitride layer on a sapphire substrate may be etched to define at least one post in the underlying gallium nitride and at least one trench in the underlying gallium nitride layer. The at least one post includes a top and a sidewall and the at least one trench includes a trench floor. The at least one floor is masked with a mask, and the sidewall of the at least one post is laterally grown into the at least one trench, to thereby form a gallium nitride semiconductor layer. As was described above, the post tops also may be masked. Preferably, the at least one floor and the at least one top are masked simultaneously, for example by performing a directional deposition that forms a mask on the lateral tops and floors, but not on the sidewalls. As also was described above, when an aluminum nitride buffer layer is present, it may be etched to define the posts and trenches, or the mask may be formed on the aluminum nitride buffer layer. In another alternative, the trench floor may be located in the gallium nitride layer itself, and the gallium nitride trench floor may be masked as was described above.

Accordingly, sapphire may be employed as a substrate for growing gallium nitride semiconductor layers that can have low defect densities. Low cost and/or high availability gallium nitride devices thereby may be provided.

DETAILED DESCRIPTION OF PREFERRED EMBODIMENTS

Figure 1:
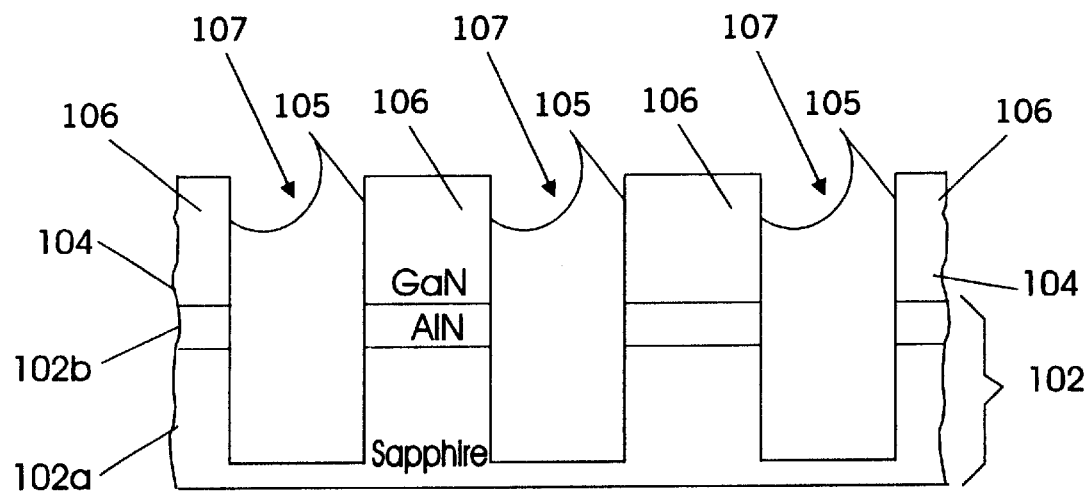
FIGS. 1–5 are cross-sectional views of first gallium nitride microelectronic structures during intermediate fabrication steps, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. Moreover, each embodiment described and illustrated herein includes its complementary conductivity type embodiment as well.

Referring now to FIGS. 1–5, methods of fabricating gallium nitride semiconductor structures according to embodiments of the present invention now will be described. As shown in FIG. 1, an underlying gallium nitride layer 104 is grown on a substrate 102. The substrate 102 includes a sapphire ($Al_2O_3$) substrate 102a, preferably with (0001) (c-plane) orientation, and also preferably includes an aluminum nitride and/or gallium nitride buffer layer 102b. The crystallographic designation conventions used herein are well known to those having skill in the art, and need not be described further. The gallium nitride layer 104 may be between 0.5 and 2.0 µm thick, and may be grown at 1000° C. on a low temperature (600° C.) aluminum nitride buffer layer and/or a low temperature (500°) gallium nitride buffer layer 102b that was deposited on the sapphire substrate 102a in a cold wall vertical and inductively heated metalorganic vapor phase epitaxy system using triethylgallium at 26 µmol/min, ammonia at 1500 sccm and 3000 sccm hydrogen diluent. The growth of a gallium nitride layer on a sapphire substrate including an aluminum nitride buffer layer is described in publications entitled *Improvements on the Electrical and Luminescent Properties of Reactive Molecular Beam Epitaxially Grown GaN Films by Using AlN-Coated Sapphire Substrates* to Yoshida et al., Appl. Phys. Lett. 42(5), Mar. 1, 1983, pp. 427–429; *Metalorganic Vapor Phase Epitaxial Growth of a High Quality GaN Film Using an AlN Buffer Layer* to Amano et al., Appl. Phys. Lett., 48(5), February 1986, pp. 353–355; *Influence of Buffer Layers on the Deposition of High Quality Single Crystal GaN Over Sapphire Substrate* to Kuznia et al., J. Appl. Phys. 73(9), May 1, 1993, pp. 4700–4702; *GaN Growth Using GaN Buffer Layer* to Nakamura, Japanese Journal of Applied Physics, Vol. 30, No. 10A, October 1991, pp. L1705–L1707; *The Effect of GaN and AlN Buffer Layers on GaN Film Properties Grown on Both C-Plane and A-Plane Sapphire* to Doverspike et al., Journal of Electronic Materials, Vol. 24, No. 4, 1995, pp. 269–273, the disclosures of which are hereby incorporated herein by reference.

Still referring to FIG. 1, the underlying gallium nitride layer 104 includes a plurality of sidewalls 105 therein. It will be understood by those having skill in the art that the sidewalls 105 may be thought of as being defined by a plurality of spaced apart posts 106, that also may be referred to as "mesas", "pedestals" or "columns". The sidewalls 105 may also be thought of as being defined by a plurality of trenches 107, also referred to as "wells" in the underlying gallium nitride layer 104. The sidewalls 105 may also be thought of as being defined by a series of alternating trenches 107 and posts 106. Moreover, a single post 106 may be provided, that may be thought of as being defined by at least one trench 107 adjacent the single post. It will be understood that the posts 106 and the trenches 107 that define the sidewalls 105 may be fabricated by selective etching and/or selective epitaxial growth and/or other conventional techniques. Moreover, it will also be understood that the sidewalls need not be orthogonal to the substrate 102, but rather may be oblique thereto. Finally, it will also be understood that although the sidewalls 105 are shown in cross-section in FIG. 1, the posts 106 and trenches 107 may define elongated regions that are straight, V-shaped or have other shapes. As shown in FIG. 1, the trenches 107 preferably extend into the buffer layer 102b and into the substrate 102a, so that subsequent gallium nitride growth occurs preferentially on the sidewalls 105 rather than on the trench floors.

Figure 2:
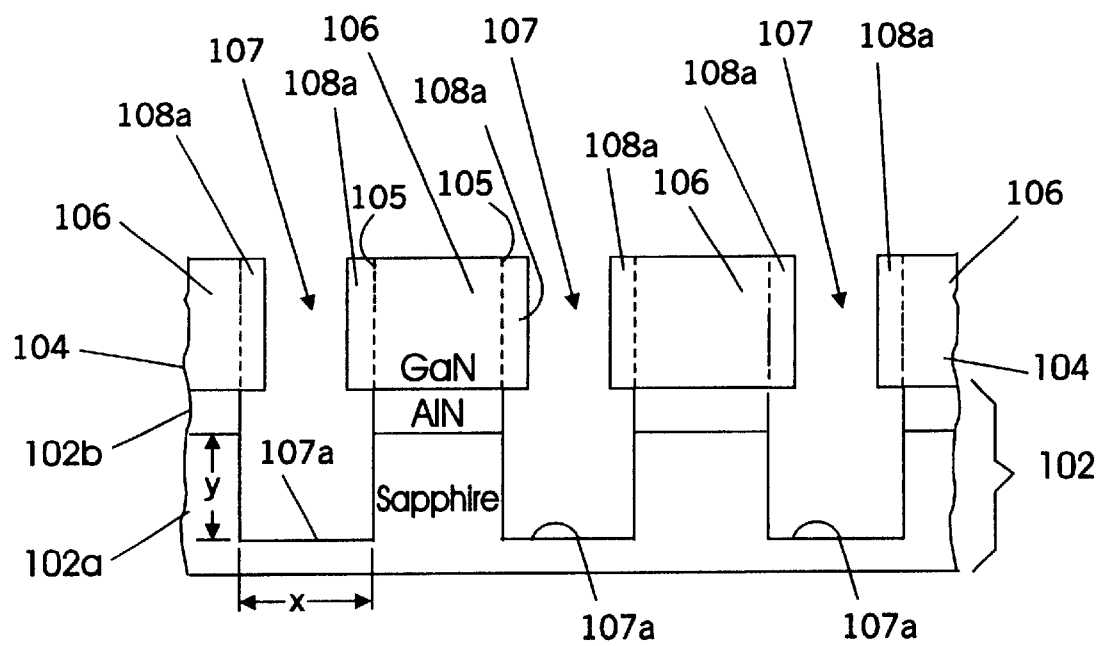

Referring now to FIG. 2, the sidewalls 105 of the underlying gallium nitride layer 104 are laterally grown to form a lateral gallium nitride layer 108a in the trenches 107. Lateral growth of gallium nitride may be obtained at 1000–1100° C. and 45 Torr. The precursors TEG at 13–39 µmol/min and $NH_3$ at 1500 sccm may be used in combination with a 3000 sccm $H_2$ diluent. If gallium nitride alloys are formed, additional conventional precursors of aluminum or indium, for example, may also be used. As used herein, the term "lateral" means a direction that is orthogonal to the sidewalls 105. It will also be understood that some vertical growth on the posts 106 may also take place during the lateral growth from sidewalls 105. As used herein, the term "vertical" denotes a directional parallel to the sidewalls 105.

When the sapphire substrate is exposed to the gas phase during growth of gallium nitride, it has been found that gallium nitride can nucleate on the sapphire. Thus, vertical growth of gallium nitride may take place from the sapphire trench floors, that can interfere with lateral growth of the gallium nitride sidewalls into the at least one trench. Alternatively, because of the presence of ammonia, the exposed areas of the surface of the sapphire may be converted to aluminum nitride. Unfortunately, gallium nitride can nucleate well on aluminum nitride, and thereby allow vertical growth of the gallium nitride from the trench floor, which can interfere with the lateral growth of the gallium nitride sidewalls.

The conversion of the exposed areas of the surface of the sapphire to aluminum nitride may be reduced and preferably eliminated by using a high growth temperature for growing the gallium nitride. For example, a temperature of about 1100° C. may be used rather than a conventional temperature of about 1000° C. However, this still may not prevent the nucleation of gallium nitride on the floor of the sapphire substrate.

Referring again to FIG. 2, according to the present invention, the sapphire substrate 102a is etched sufficiently deep to prevent vertical growth of gallium nitride from the sapphire trench floor 107a from interfering with the step of laterally growing the gallium nitride sidewalls of the at least one post into the at least one trench. For example, the ratio of the sapphire sidewall height y to the sapphire floor width x may be at least 1/4. Other ratios may be used depending on the vertical to lateral growth rate ratio during gallium nitride growth. Under the conditions described below, the lateral growth rate of gallium nitride can be faster than the vertical growth rate. Under these conditions, and with sufficiently deep trenches, the sidewall growth from the posts can coalesce over the trenches before the vertical gallium nitride growth in the trenches that results from nucleation of gallium nitride on the sapphire substrate can interfere with the lateral growth.

Figure 3:
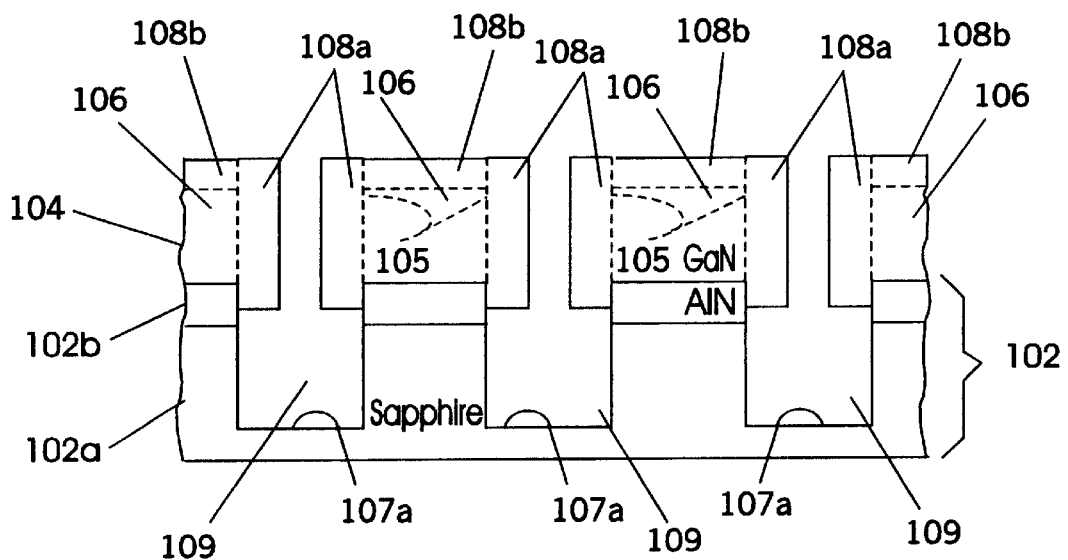

Referring now to FIG. 3, continued growth of the lateral gallium nitride layer 108a causes vertical growth onto the underlying gallium nitride layer 104, specifically onto the posts 106, to form a vertical gallium nitride layer 108b. Growth conditions for vertical growth may be maintained as was described in connection with FIG. 2. As also shown in FIG. 3, continued vertical growth into trenches 107 may take place at the bottom of the trenches. A void 109 preferably remains between the lateral gallium nitride layer 108a and the trench floor 107a.

Figure 4:
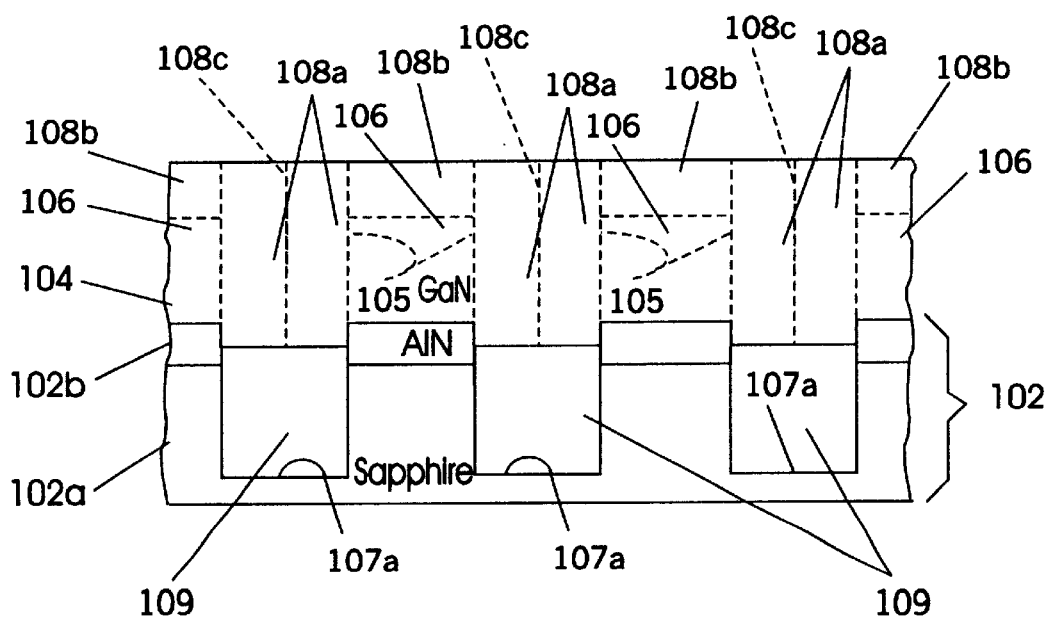
Figure 5:
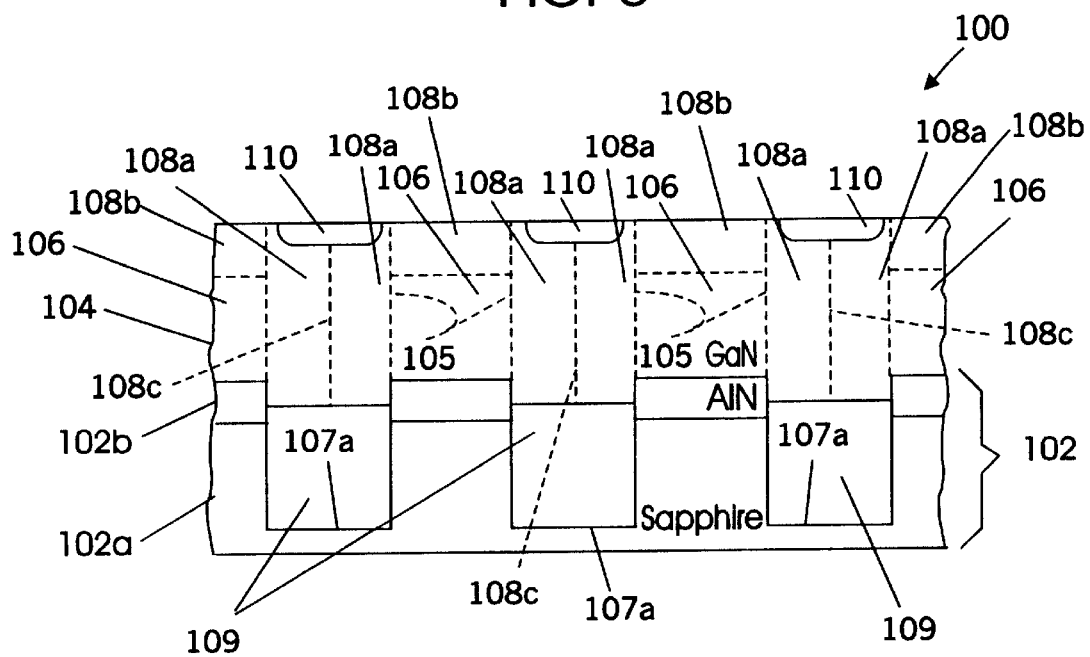

Referring now to FIG. 4, growth is allowed to continue until the lateral growth fronts coalesce in the trenches 107 at the interfaces 108c, to form a continuous gallium nitride semiconductor layer in the trenches. The total growth time may be approximately 60 minutes. As shown in FIG. 5, microelectronic devices 110 may then be formed in the lateral gallium nitride semiconductor layer 108a. Devices may also be formed in vertical gallium nitride layer 108b.

Accordingly, in FIG. 5, gallium nitride semiconductor structures 100 according to embodiments of the present invention are illustrated. The gallium nitride structures 100 include the substrate 102. The substrate includes the sapphire substrate 102a and the aluminum nitride buffer layer 102b on the sapphire substrate 102a. The aluminum nitride and/or gallium nitride buffer layer 102b may be about 200–300 Å thick.

The underlying gallium nitride layer 104 is also included on the buffer layer 102b opposite the substrate 102a. The underlying gallium nitride layer 104 may be between about 0.5 and 2.0 μm thick, and may be formed using metalorganic vapor phase epitaxy (MOVPE). The underlying gallium nitride layer generally has an undesired relatively high defect density. For example, dislocation densities of between about $10^8$ and $10^{10}$ cm$^{-2}$ may be present in the underlying gallium nitride layer. These high defect densities may result from mismatches in lattice parameters between the buffer layer 102b and the underlying gallium nitride layer 104, and/or other causes. These high defect densities may impact the performance of microelectronic devices formed in the underlying gallium nitride layer 104.

Still continuing with the description of FIG. 5, the underlying gallium nitride layer 104 includes the plurality of sidewalls 105 that may be defined by the plurality of posts 106 and/or the plurality of trenches 107. As was described above, the sidewalls may be oblique and of various elongated shapes. The posts 106 include a gallium nitride top, a gallium nitride sidewall and a sapphire sidewall, and the at least one trench includes a sapphire floor 107a. The sapphire floor 107a preferably is free of a vertical gallium nitride layer thereon. The sapphire sidewall height to sapphire floor width ratio preferably is at least 1/4.

Continuing with the description of FIG. 5, the lateral gallium nitride layer 108a extends from the plurality of sidewalls 105 of the underlying gallium nitride layer 104. The lateral gallium nitride layer 108a may be formed using metalorganic vapor phase epitaxy at about 1000–1100° C. and 45 Torr. Precursors of triethygallium (TEG) at 13–39 μmol/min and ammonia (NH$_3$) at 1500 sccm may be used in combination with a 3000 sccm H$_2$ diluent, to form the lateral gallium nitride layer 108a. The gallium nitride semiconductor structure 100 also includes the vertical gallium nitride layer 108b that extends vertically from the posts 106.

As shown in FIG. 5, the lateral gallium nitride layer 108a coalesces at the interfaces 108c to form a continuous lateral gallium nitride semiconductor layer 108a in the trenches. It has been found that the dislocation densities in the underlying gallium nitride layer 104 generally do not propagate laterally from the sidewalls 105 with the same density as vertically from the underlying gallium nitride layer 104. Thus, the lateral gallium nitride layer 108a can have a relatively low defect density, for example less that $10^4$ cm$^{-2}$. Accordingly, the lateral gallium nitride layer 108b may form device quality gallium nitride semiconductor material. Thus, as shown in FIG. 5, microelectronic devices 110 may be formed in the lateral gallium nitride semiconductor layer 108a. It will also be understood that a mask need not be used to fabricate the gallium nitride semiconductor structures 100 of FIG. 5, because lateral growth is directed from the sidewalls 105.

Figure 6:
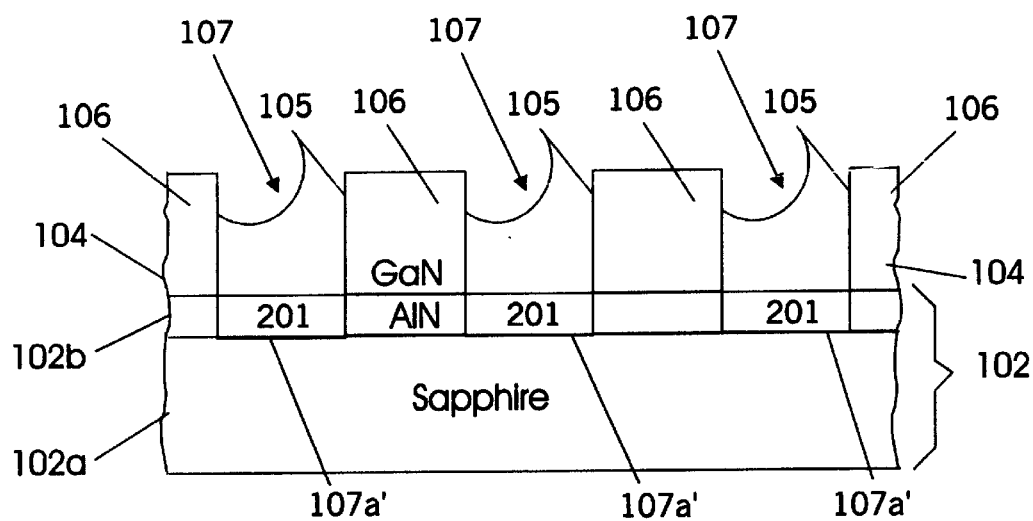
FIGS. 6–10 are cross-sectional views of other gallium nitride microelectronic structures during intermediate fabrication steps, according to the present invention.
Figure 7:
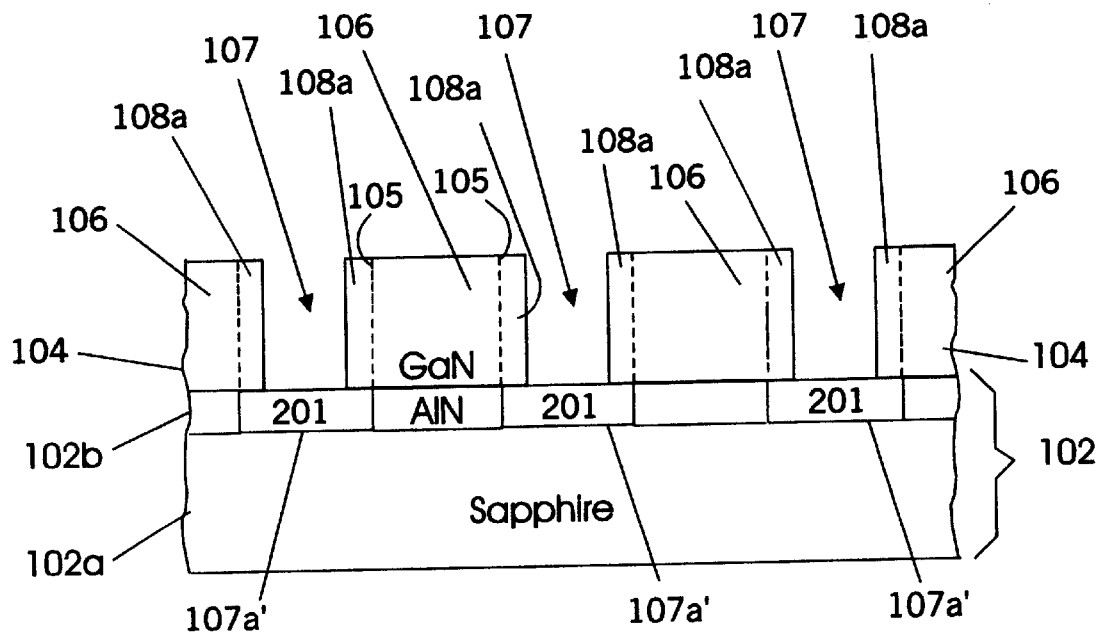
Figure 8:
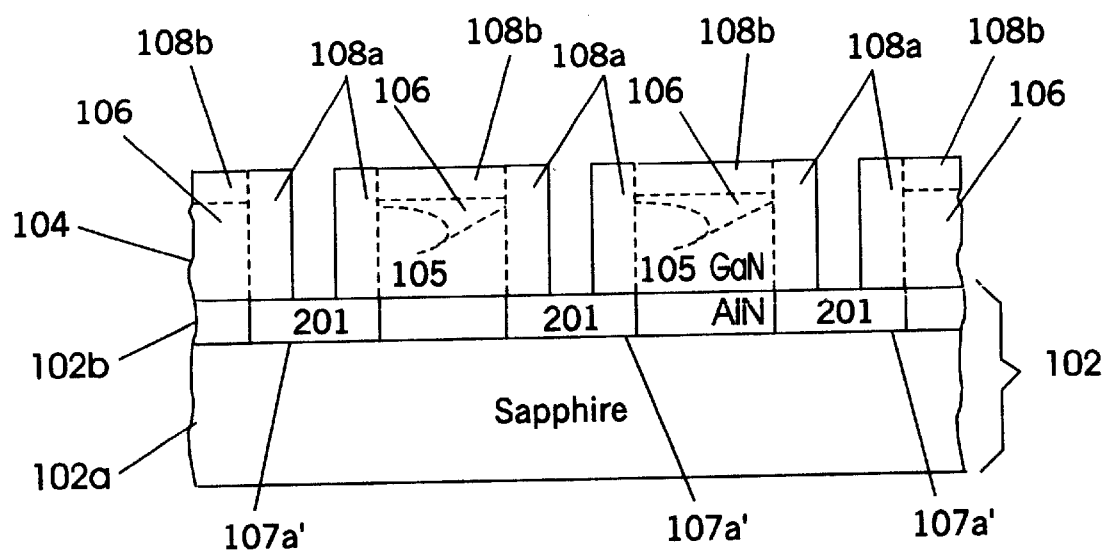
Figure 9:
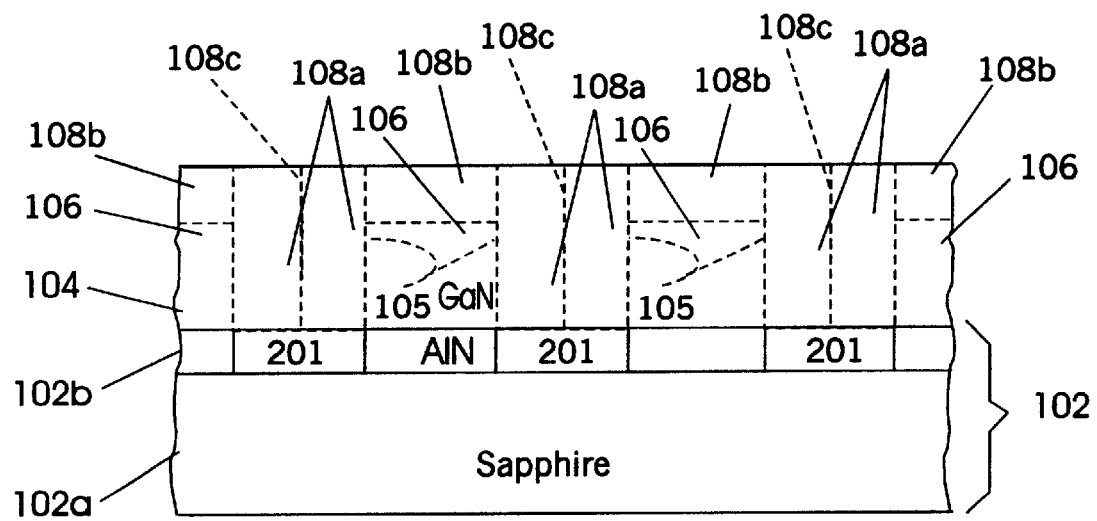
Figure 10:
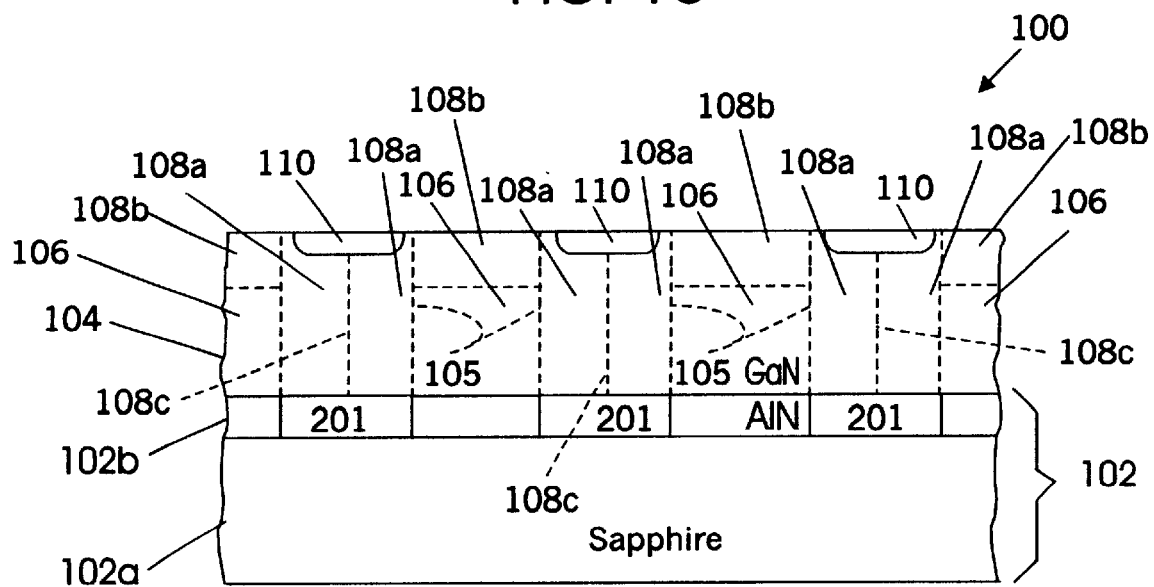

FIGS. 6–10 illustrate other embodiments according to the present invention. As shown in FIG. 6, a mask 201 is formed on the trench floors 107a'. When forming the mask 201 on the trench floors 107a', the trench need not be etched into the sapphire substrate 102a. Rather, as shown in FIG. 6, the trench may only be etched through the aluminum nitride buffer layer 102b. However, it will be understood by those having skill in the art that the trench also may be etched into the sapphire substrate 102a, as was illustrated in FIG. 1, and the trench floor 107a in the sapphire substrate may be masked with a mask 201. In still another alternative, the trench may be etched only partially into the aluminum nitride buffer layer 102b, rather than entirely through the aluminum nitride buffer layer 102b as shown in FIG. 6. In yet another alternative, the trench need not be etched into the aluminum nitride buffer layer 102b at all, but rather the mask 201 may be formed on the exposed portion of the aluminum nitride buffer layer 102b. In yet another alternative, the trenches may not extend into the aluminum nitride buffer layer, but rather may terminate within the gallium nitride layer 104, and the mask 201 may be formed on the gallium nitride floor. Finally, it will be understood that although the mask 201 is shown to have the same thickness as the aluminum nitride buffer layer 102b, it need not have the same thickness. Rather, it can be thinner or thicker.

It has been found, according to the present invention, that gallium nitride does not nucleate appreciably on certain amorphous and crystalline materials, such as silicon dioxide, silicon nitride and certain metals such as tungsten. Accordingly, a "line of sight" deposition technique, such as thermal evaporation or electron beam evaporation, may be used to deposit a masking material such as silicon dioxide, silicon nitride and/or tungsten on the trench floors. Since the gallium nitride does not nucleate specifically on the mask, it can be forced to grow off the sidewalls of the posts only. The remaining processing steps of FIGS. 6–10 correspond to those of FIGS. 1–5, and need not be described again herein.

FIGS. 11–16 illustrate yet other embodiments according to the present invention. In FIGS. 11–16, the sapphire substrate 102a is etched sufficiently deep to prevent vertical growth of gallium nitride from the sapphire floor from interfering with the step of laterally growing the gallium nitride sidewalls of the at least one post into the at least one trench, as was described in connection with FIGS. 1–5, and need not be described herein again. However, in contrast with FIGS. 1–5, in FIGS. 11–16, a mask, such as a silicon dioxide, silicon nitride and/or tungsten mask 209 is included on the underlying gallium nitride layer 104. The mask 209 may have a thickness of about 1000Å or less and may be formed on the underlying gallium nitride layer 104 using low pressure Chemical Vapor Deposition (CVD) of silicon dioxide and/or silicon nitride. Alternatively, electron beam or thermal evaporation may be used to deposit tungsten. The mask 209 is patterned to provide an array of openings therein, using conventional photolithography techniques.

Figure 11:
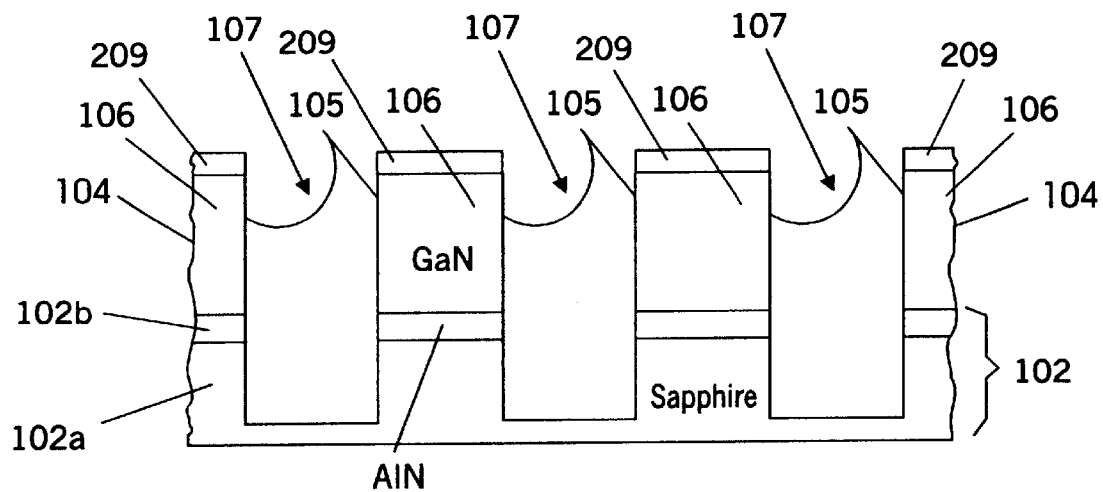
FIGS. 11–16 are cross-sectional views of yet other gallium nitride microelectronic structures during intermediate fabrication steps, according to the present invention.

As shown in FIG. 11, the underlying gallium nitride layer is etched through the array of openings to define the plurality of posts 106 in the underlying gallium nitride layer 104 and the plurality of trenches 107 therebetween. The posts each include the sidewall 105 and a top having the mask 209 thereon. It will also be understood that although the posts 106 and trenches 107 are preferably formed by masking and etching as described above, the posts may also be formed by selectively growing the posts from an underlying gallium nitride layer and then forming a capping layer on the tops of the posts. Combinations of selective growth and selective etching also may be used.

Figure 12:
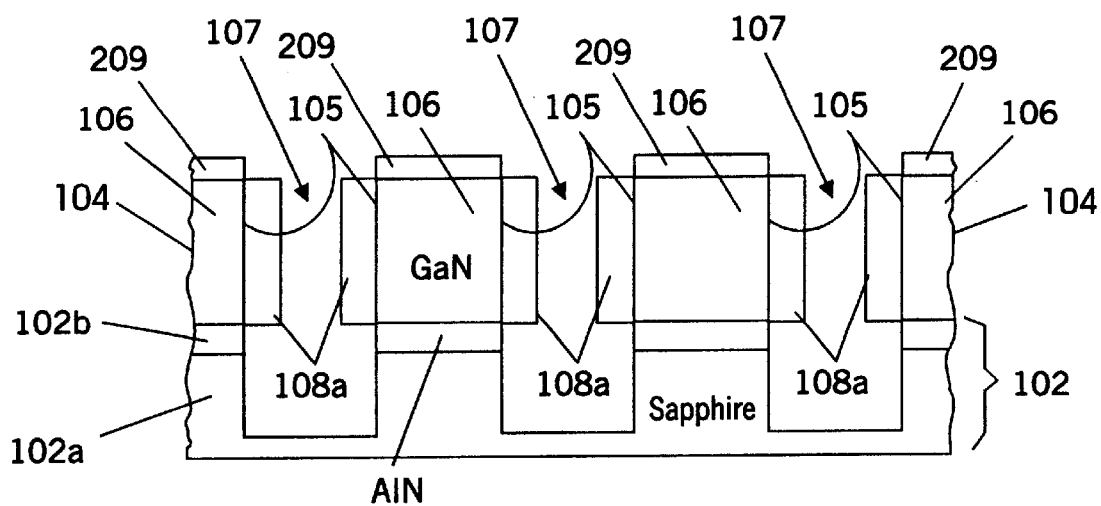

As shown in FIG. 12, the sidewalls 105 of the underlying gallium nitride layer 104 are laterally grown to form a lateral gallium nitride layer 108a in the trenches 107. Lateral growth may proceed as was described above. It will be understood that growth and/or nucleation on the top of the posts 106 is reduced and preferably eliminated by the mask 209.

Figure 13:
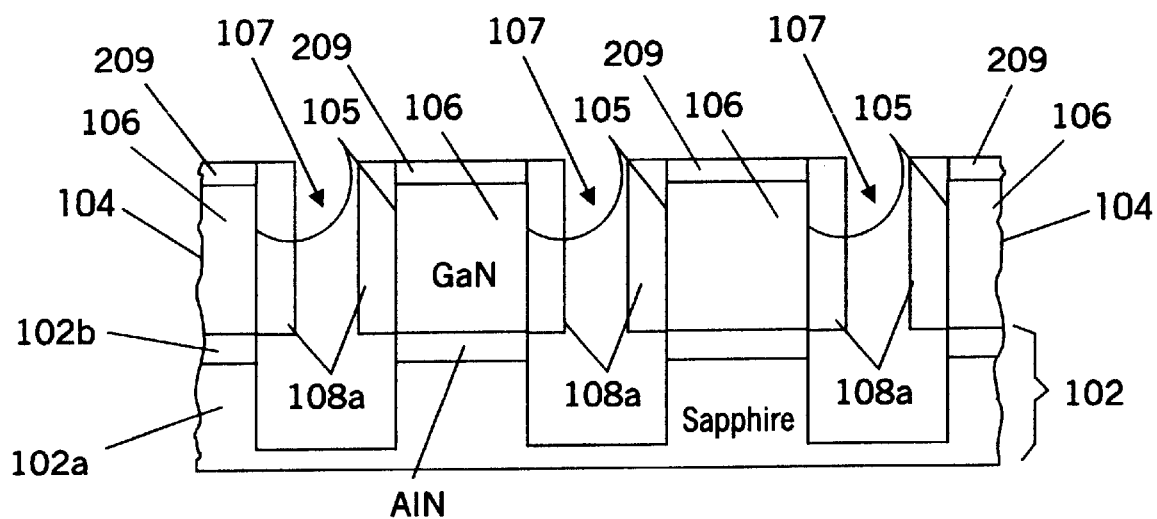

Referring to FIG. 13, continued growth of the lateral gallium nitride layer 108a causes vertical growth of the lateral gallium nitride layer 108a through the array of openings. Conditions for vertical growth may be maintained as was described in connection with FIG. 12.

Figure 14:
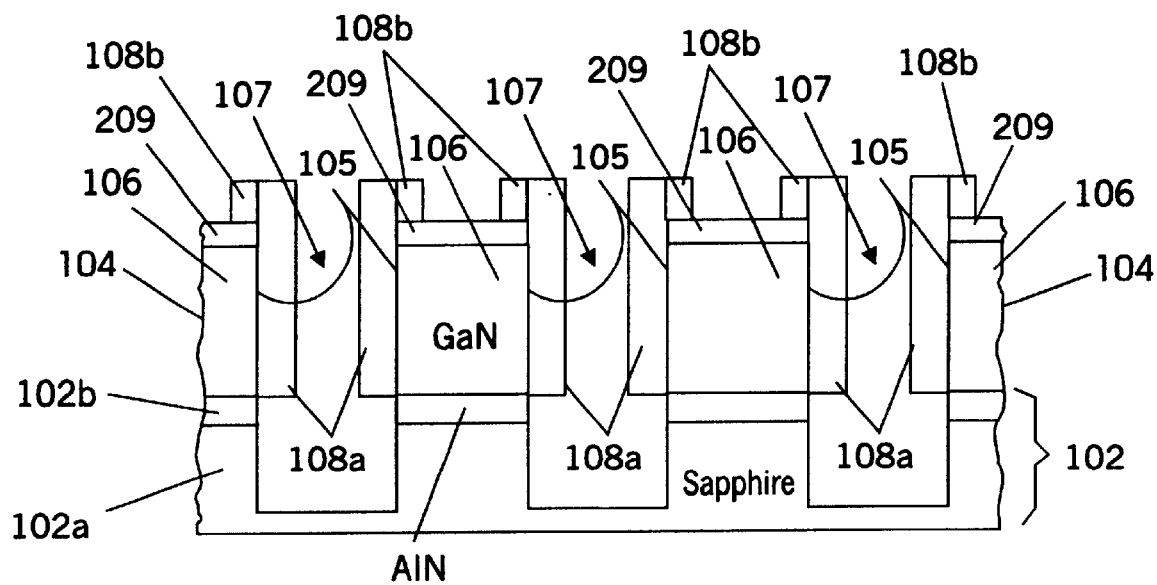

Referring now to FIG. 14, continued growth of the lateral gallium nitride layer 108a causes lateral overgrowth onto the mask 209, to form an overgrown lateral gallium nitride layer 108b. Growth conditions for overgrowth may be maintained as was described in connection with FIG. 12.

Figure 15:
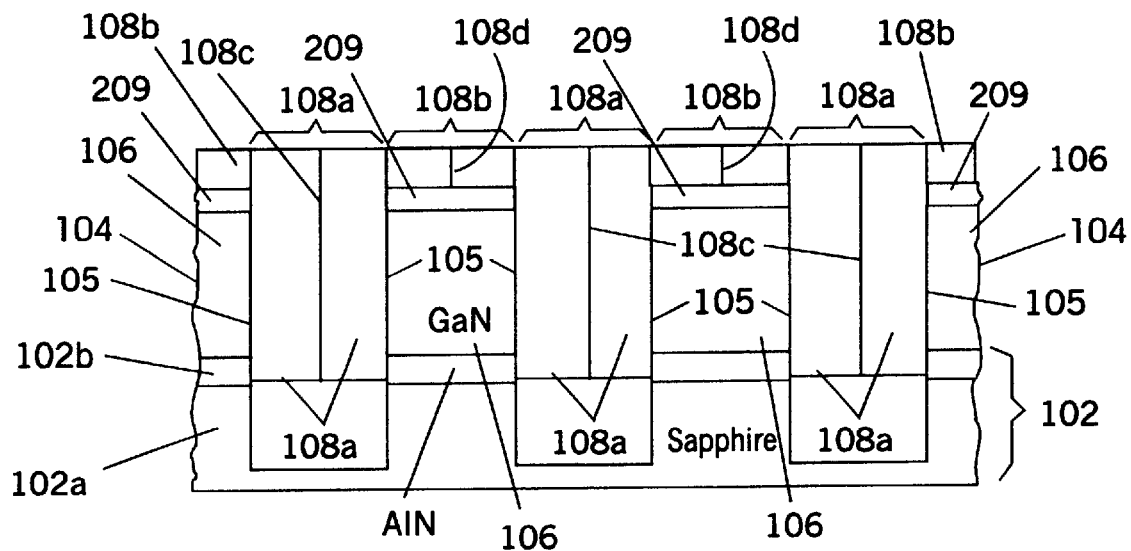

Referring now to FIG. 15, growth is allowed to continue until the lateral growth fronts coalesce in the trenches 107 at the interfaces 108c, to form a continuous lateral gallium nitride semiconductor layer 108a in the trenches.

Figure 16:
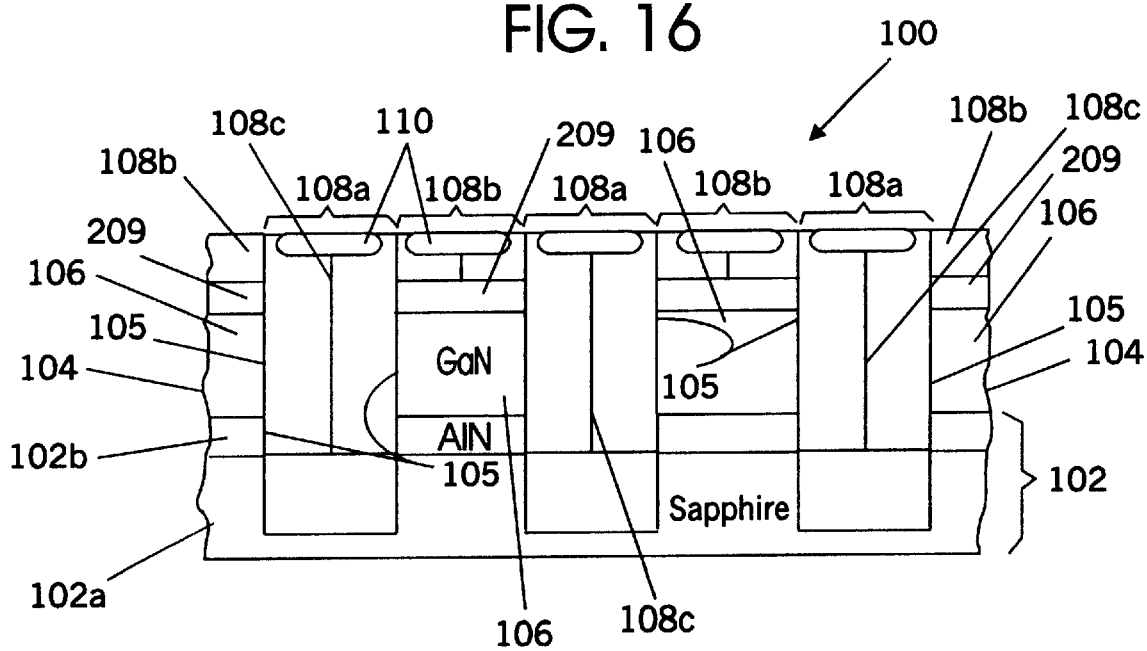
Figure 17:
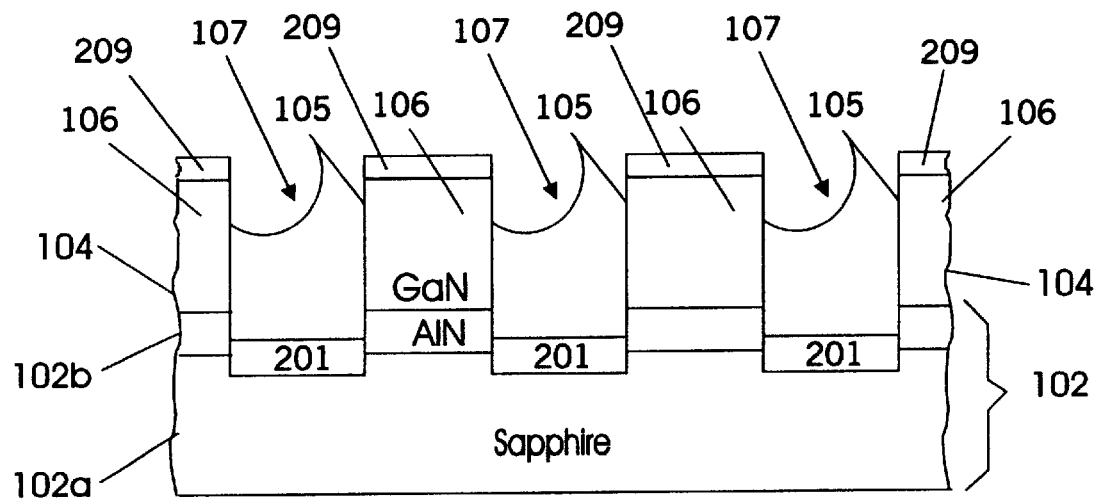
FIGS. 17–22 are cross-sectional views of still other gallium nitride microelectronic structures during intermediate fabrication steps, according to the present invention.
Figure 18:
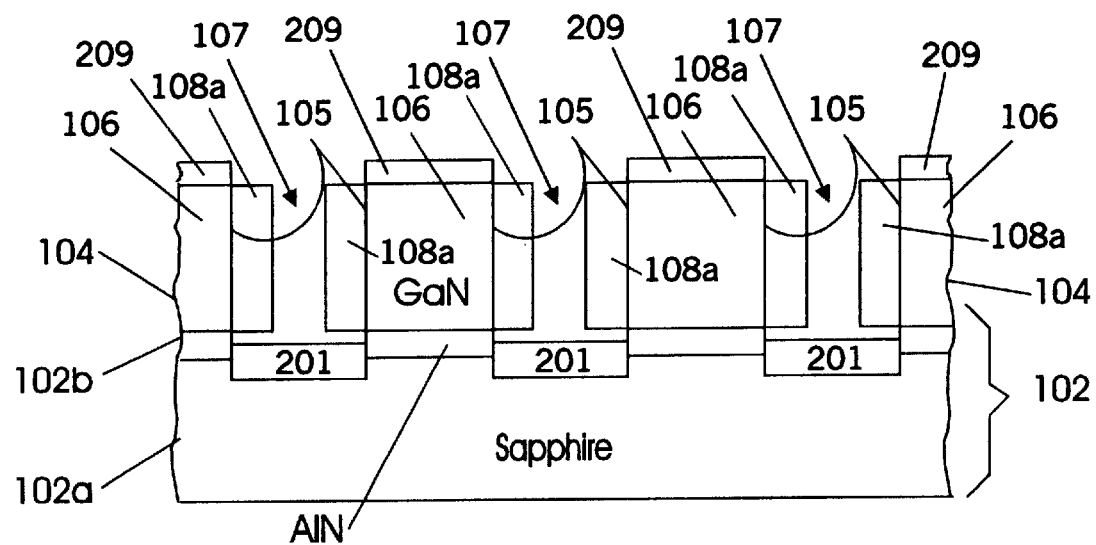
Figure 19:
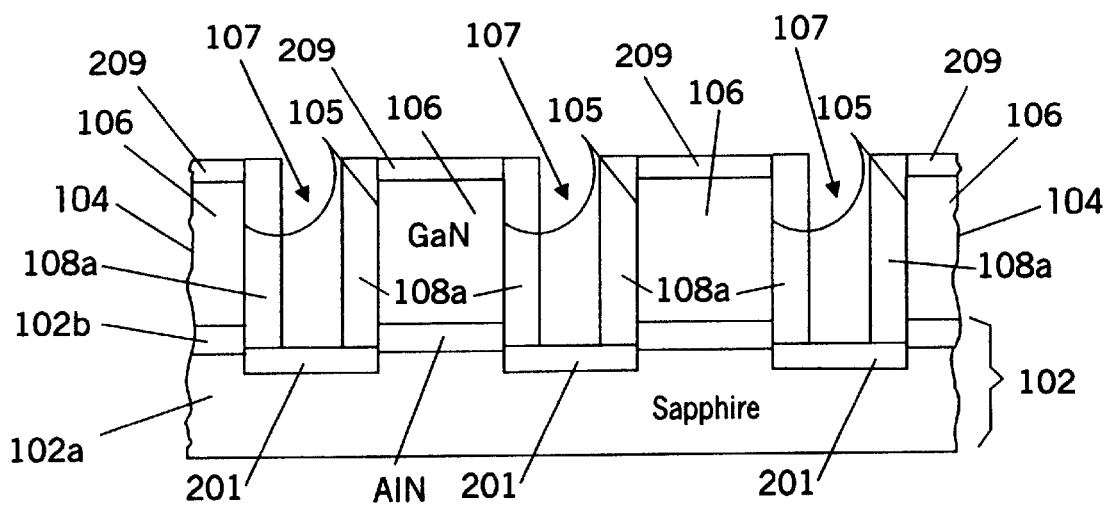
Figure 20:
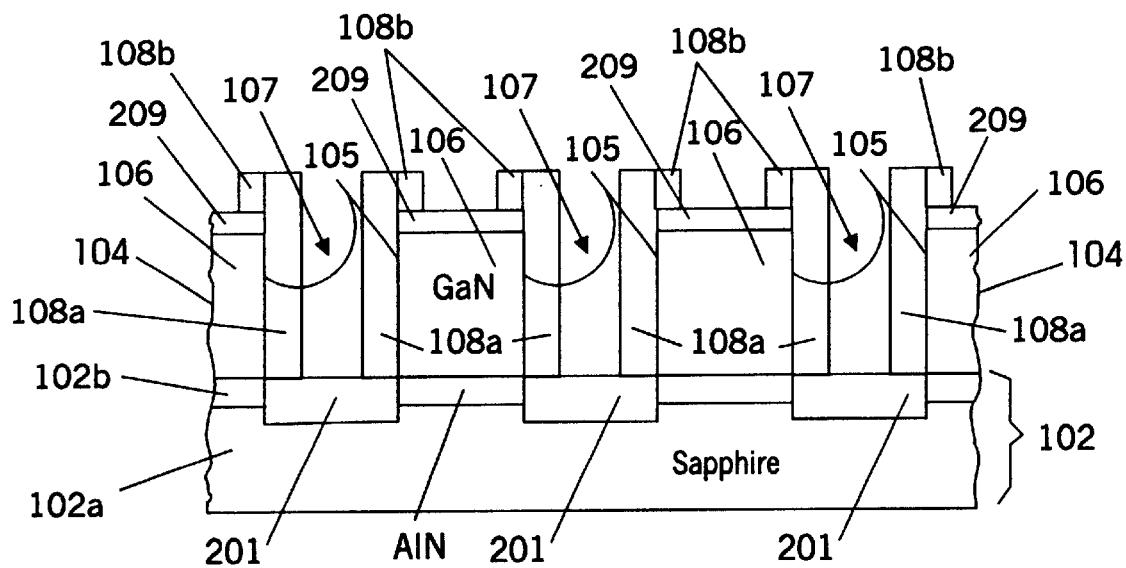
Figure 21:
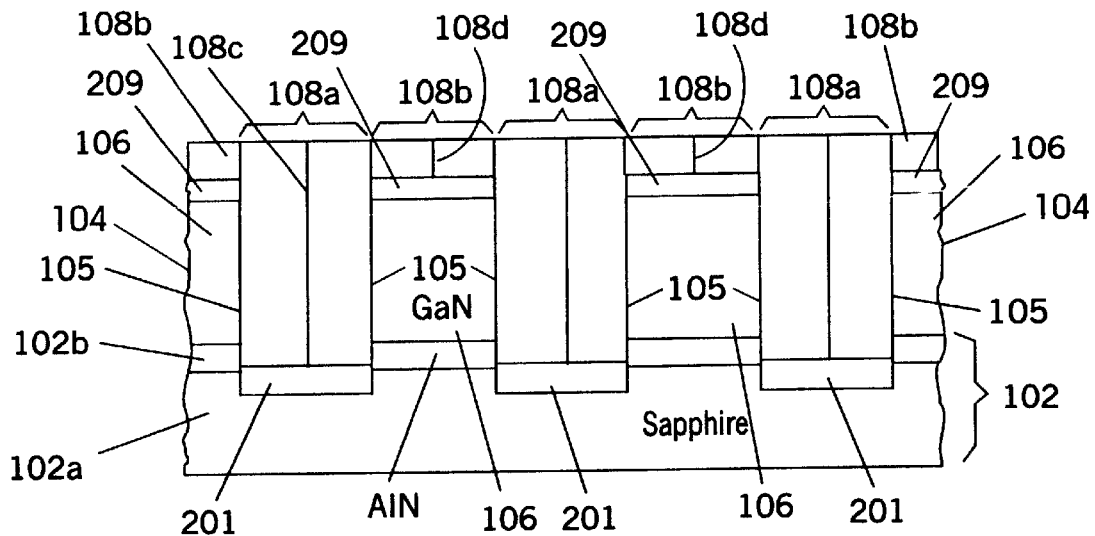
Figure 22:
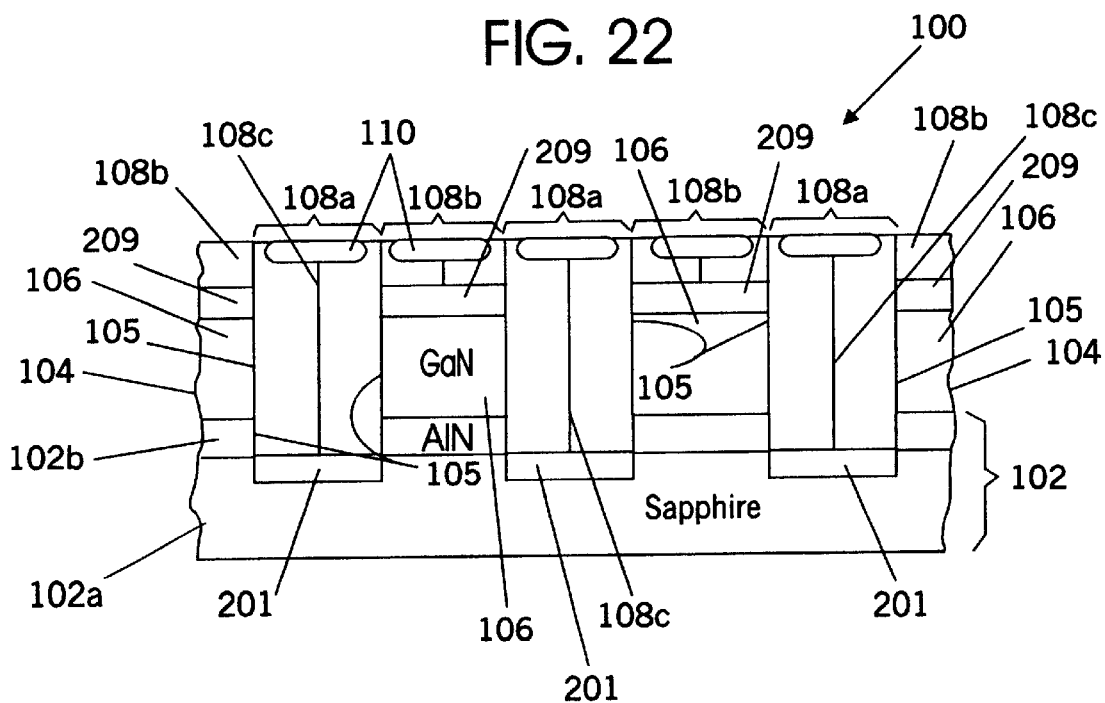

Still referring to FIG. 15, growth is also allowed to continue until the lateral overgrowth fronts coalesce over the mask 209 at the interfaces 108d, to form a continuous overgrown lateral gallium nitride semiconductor layer 108b. The total growth time may be approximately 60 minutes. A single continuous growth step may be used. As shown in FIG. 16, microelectronic devices 110 may then be formed in the lateral gallium nitride semiconductor layer 108a. Microelectronic devices also may be formed in the overgrown lateral gallium nitride layer 108b.

Finally, referring to FIGS. 17–22, still other embodiments of the present invention are illustrated. FIGS. 17–22 combine the mask 201 on the floor of the trenches 107, as was illustrated in FIGS. 6–10, with the mask 209 on the top of the posts 106, as was illustrated in FIG. 11. It will be understood that the mask 201 at the bottom of the trenches, and the mask 209 on the top of the posts 106, preferably are formed simultaneously and preferably comprise the same material. Accordingly, for example, line of sight of deposition techniques, such as thermal evaporation or electron beam evaporation of masking material such as silicon dioxide, silicon nitride and/or metal such as tungsten may be used. If the mask material is deposited after the etching step, it covers only the vertical surfaces, i.e. the top surfaces of the posts 106 and the bottom surfaces (floors) of the trenches 107. The gallium nitride preferably nucleates little, if at all, on the masks 201 and 209, so that gallium nitride preferably only grows from the sidewalls 105 of the posts. Alternatively, the masks 201 and 209 may comprise different materials and/or be of different thicknesses. The remaining steps of FIGS. 17–22 are similar to FIGS. 11–16, and need not be described again in detail.

It will be understood that the masks 201 may be formed on an exposed sapphire floor of the substrate 102a, on an exposed aluminum nitride floor of layer 102b, or on an exposed gallium nitride floor in layer 104. Stated differently, the trenches may be etched partly into gallium nitride layer 104, fully through gallium nitride layer 104, partly into aluminum nitride buffer layer 102b, fully through aluminum nitride layer 102b, and/or partly into sapphire substrate 102a. Moreover, the thickness of the mask 201 may be thinner than or thicker than aluminum nitride layer 102b. Accordingly, sapphire substrates may be used for growth of gallium nitride semiconductor layers, to thereby provide low cost and/or high availability.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a gallium nitride semiconductor layer comprising the steps of:
    etching an underlying gallium nitride layer on a sapphire substrate to selectively expose the sapphire substrate and define at least one post and at least one trench in the underlying gallium nitride layer, the at least one post each including a gallium nitride top and a gallium nitride sidewall, the at least one trench including a sapphire floor; and
    laterally growing the gallium nitride sidewall of the at least one post into the at least one trench at about 1100° C. while exposing the sapphire floor to thereby form a gallium nitride semiconductor layer.

2. A method according to claim 1 wherein the etching step comprises the step of:
    etching the underlying gallium nitride layer on the sapphire substrate and the sapphire substrate, to define at least one post in the underlying gallium nitride layer and in the sapphire substrate and at least one trench in the underlying gallium nitride layer and in the sapphire substrate, the at least one post each including a gallium nitride top, a gallium nitride sidewall and a sapphire sidewall, the at least one trench including a sapphire floor.

3. A method according to claim 2 wherein the step of etching comprises the step of etching the sapphire substrate sufficiently deep to prevent vertical growth of gallium nitride from the sapphire floor from interfering with the step of laterally growing the gallium nitride sidewalls of the at least one post into the at least one trench.

4. A method according to claim 2 wherein the sapphire sidewall height to sapphire floor width ratio exceeds about 1/4.

5. A method according to claim 1 wherein the etching step comprises the step of:
    etching the underlying gallium nitride layer and an aluminum nitride and/or gallium nitride buffer layer on the sapphire substrate to selectively expose the sapphire substrate and define at least one post in the underlying gallium nitride layer and in the buffer layer and at least one trench in the underlying gallium nitride layer and in the buffer layer, the at least one post including a gallium nitride top, a gallium nitride sidewall and an aluminum nitride sidewall, the at least one trench including a sapphire floor.

6. A method according to claim 5 wherein the etching step comprises the step of:
    etching the underlying gallium nitride layer, the buffer layer on the sapphire substrate and the sapphire substrate to selectively expose the sapphire substrate and define at least one post in the underlying gallium nitride layer, in the buffer layer and in the sapphire substrate, and at least one trench in the underlying gallium nitride layer in the buffer layer and in the sapphire substrate, the at least one post including a gallium nitride top, a gallium nitride sidewall, an aluminum nitride sidewall, and a sapphire sidewall, the at least one trench including a sapphire floor.

7. A method according to claim 1 wherein the step of laterally growing comprises the step of laterally overgrowing the gallium nitride sidewall of the at least one post onto the gallium nitride top at about 1100° C., to thereby form a gallium nitride semiconductor layer.

8. A method according to claim 1:
wherein the step of laterally growing is preceded by the step of masking the gallium nitride top with a mask that reduces nucleation of gallium nitride thereon compared to on gallium nitride; and
wherein the step of laterally growing comprises the step of laterally overgrowing the gallium nitride sidewall of the at least one post onto the mask at about 1100° C., to thereby form a gallium nitride semiconductor layer.

9. A method according to claim 1 wherein the step of laterally growing is followed by the step of forming at least one microelectronic device in the gallium nitride semiconductor layer.

10. A method according to claim 1 wherein the step of etching is preceded by the step of forming the underlying gallium nitride layer on the sapphire substrate at about 1100° C.

11. A method of fabricating a gallium nitride semiconductor layer comprising the steps of:
etching an underlying gallium nitride layer on a sapphire substrate to selectively expose the sapphire substrate and define at least one post and at least one trench in the underlying gallium nitride layer, the at least one post each including a gallium nitride top and a gallium nitride sidewall, the at least one trench including a sapphire floor; and
laterally growing the gallium nitride sidewall of the at least one post into the at least one trench at more than about 1000° C., while exposing the sapphire floor to thereby form a gallium nitride semiconductor layer.

12. A method according to claim 11 wherein the etching step comprises the step of:
etching the underlying gallium nitride layer on the sapphire substrate and the sapphire substrate, to define at least one post in the underlying gallium nitride layer and in the sapphire substrate and at least one trench in the underlying gallium nitride layer and in the sapphire substrate, the at least one post each including a gallium nitride top, a gallium nitride sidewall and a sapphire sidewall, the at least one trench including a sapphire floor.

13. A method according to claim 12 wherein the step of etching comprises the step of etching the sapphire substrate sufficiently deep to prevent vertical growth of gallium nitride from the sapphire floor from interfering with the step of laterally growing the gallium nitride sidewalls of the at least one post into the at least one trench.

14. A method according to claim 12 wherein the sapphire sidewall height to sapphire floor width ratio exceeds about 1/4.

15. A method according to claim 11 wherein the etching step comprises the step of:
etching the underlying gallium nitride layer and an aluminum nitride and/or gallium nitride buffer layer on the sapphire substrate to selectively expose the sapphire substrate and define at least one post in the underlying gallium nitride layer and in the buffer layer and at least one trench in the underlying gallium nitride layer and in the buffer layer, the at least one post including a gallium nitride top, a gallium nitride sidewall and an aluminum nitride sidewall, the at least one trench including a sapphire floor.

16. A method according to claim 15 wherein the etching step comprises the step of:
etching the underlying gallium nitride layer, the buffer layer on the sapphire substrate and the sapphire substrate to selectively expose the sapphire substrate and define at least one post in the underlying gallium nitride layer, in the buffer layer and in the sapphire substrate, and at least one trench in the underlying gallium nitride layer in the buffer layer and in the sapphire substrate, the at least one post including a gallium nitride top, a gallium nitride sidewall, an aluminum nitride sidewall, and a sapphire sidewall, the at least one trench including a sapphire floor.

17. A method according to claim 10 wherein the step of laterally growing comprises the step of laterally overgrowing the gallium nitride sidewall of the at least one post onto the gallium nitride top at more than about 1100° C., to thereby form a gallium nitride semiconductor layer.

18. A method according to claim 11:
wherein the step of laterally growing is preceded by the step of masking the gallium nitride top with a mask that reduces nucleation of gallium nitride thereon compared to on gallium nitride; and
wherein the step of laterally growing comprises the step of laterally overgrowing the gallium nitride sidewall of the at least one post onto the mask at more than about 1100° C., to thereby form a gallium nitride semiconductor layer.

19. A method according to claim 11 wherein the step of laterally growing is followed by the step of forming at least one microelectronic device in the gallium nitride semiconductor layer.

20. A method according to claim 11 wherein the step of etching is preceded by the step of forming the underlying gallium nitride layer on the sapphire substrate at about 1000° C.

21. A method according to claim 11 wherein the step of laterally growing comprises the step of laterally growing the gallium nitride sidewall of the at least one post into the at least one trench at between about 1000° C. and about 1100° C.

22. A method of fabricating a gallium nitride semiconductor layer comprising the steps of:
etching an underlying gallium nitride layer on a sapphire substrate to define at least one post and at least one trench in the underlying gallium nitride layer, the at least one post each including a gallium nitride top and a gallium nitride sidewall; and
laterally growing the gallium nitride sidewall of the at least one post into the at least one trench at more than 1000° C. while exposing the gallium nitride top to thereby form a gallium nitride semiconductor layer.

23. A method according to claim 22, wherein the etching step comprises the step of etching the underlying gallium nitride layer on the sapphire substrate and the sapphire substrate, to define at least one post in the underlying gallium nitride layer and in the sapphire substrate and at least one trench in the underlying gallium nitride layer and in the sapphire substrate, the at least one post each including a gallium nitride top, a gallium nitride sidewall and a sapphire sidewall, the at least one trench including a sapphire floor.

24. A method according to claim 23 wherein the step of etching comprises the step of etching the sapphire substrate sufficiently deep to prevent vertical growth of gallium nitride from the sapphire floor from interfering with the step of laterally growing the gallium nitride sidewalls of the at least one post into the at least one trench.

25. A method according to claim 23 wherein the sapphire sidewall height to sapphire floor width ratio exceeds about 1/4.

26. A method according to claim 22 wherein the following step is performed between the steps of etching and laterally growing:
   masking the sapphire floor with a mask that reduces nucleation of gallium nitride thereon compared to on sapphire.

27. A method according to claim 22 wherein the etching step comprises the step of:
   etching the underlying gallium nitride layer and an aluminum nitride and/or gallium nitride buffer layer on the sapphire substrate to selectively expose the sapphire substrate and define at least one post in the underlying gallium nitride layer and in the buffer layer, and at least one trench in the underlying gallium nitride layer and in the buffer layer, the at least one post including a gallium nitride top, a gallium nitride sidewall and a sapphire sidewall, the at least on trench including a sapphire floor.

28. A method according to claim 27 wherein the etching step comprises the step of:
   etching the underlying gallium nitride layer, the buffer layer, and the sapphire substrate to selectively expose the sapphire substrate and define at least one post in the underlying gallium nitride layer, in the buffer layer, and in the sapphire substrate and at least one trench in the underlying gallium nitride layer, in the buffer layer, and in the sapphire substrate, the at least one post including a gallium nitride top, a gallium nitride sidewall and a sapphire sidewall, the at least on trench including a sapphire floor.

29. A method according to claim 22 wherein the step of laterally growing comprises the step of laterally overgrowing the gallium nitride sidewall of the at least one post onto the gallium nitride top at more than about 1100° C., to thereby form a gallium nitride semiconductor.

30. A method according to claim 22 wherein the step of laterally growing is followed by the step of forming at least one microelectronic device in the gallium nitride semiconductor layer.

31. A method according to claim 22 wherein the step of etching is preceded by the step of forming the underlying gallium nitride layer on the sapphire substrate at about 1000° C.

32. A method according to claim 22 wherein the laterally growing step comprises laterally growing the gallium nitride sidewall of the at least one post into the at least one trench at between about 1000° C. and about 1100° C.

* * * * *

UNITED STATES PATENT AND TRADEMARK OFFICE
CERTIFICATE OF CORRECTION

PATENT NO.   : 6,489,221 B2
DATED        : December 3, 2002
INVENTOR(S)  : Gehrke, Thomas It is certified that error appears in the above-identified patent and that said Letters Patent is hereby corrected as shown below:

<u>Column 14,</u>
Line 5, please delete "on" and insert -- one --.

Signed and Sealed this

Twenty-fifth Day of February, 2003

JAMES E. ROGAN
*Director of the United States Patent and Trademark Office*